United States Patent [19]

Bendel

[11] Patent Number: 4,656,425
[45] Date of Patent: Apr. 7, 1987

[54] METHOD TO ELIMINATE THE EFFECTS OF MAGNETIC FIELD INHOMOGENEITIES IN NMR IMAGING AND APPARATUS THEREFOR

[75] Inventor: Peter Bendel, Rishon Le Zion, Israel

[73] Assignee: Yeda Research and Development Co., Rehovot, Israel

[21] Appl. No.: 598,237

[22] Filed: Apr. 9, 1984

[30] Foreign Application Priority Data

Apr. 10, 1983 [IL] Israel .................................. 68344

[51] Int. Cl.4 .......................................... G01R 33/20
[52] U.S. Cl. .................................. 324/309; 324/307
[58] Field of Search ............... 324/307, 309, 320, 312, 324/313, 314

[56] References Cited

U.S. PATENT DOCUMENTS

| 3,789,832 | 2/1974 | Damadian | 324/309 |
| 4,165,479 | 8/1979 | Mansfield | 324/313 |
| 4,297,637 | 10/1981 | Crooks et al. | 324/309 |
| 4,451,788 | 5/1984 | Edelstein et al. | 324/309 |

FOREIGN PATENT DOCUMENTS 0074022 3/1983 European Pat. Off. .
0086972 8/1983 European Pat. Off. .

OTHER PUBLICATIONS

Mansfield, P. and I. L. Pykett, "Biological and Medical Imaging by NMR," Journal of Magnetic Resonance 29, pp. 355-373 (1978).

Primary Examiner—Stewart J. Levy
Assistant Examiner—Kevin D. O'Shea
Attorney, Agent, or Firm—Browdy and Neimark

[57] ABSTRACT

NMR imaging apparatus comprising apparatus for applying a linear magnetic field gradient to a sample, apparatus for varying the magnetic field gradient in a predetermined manner, apparatus for obtaining an NMR signal based on the linear magnetic field gradient, apparatus for storing the NMR signal, apparatus for reconstructing an NMR image from the stored NMR signal, and display apparatus for displaying the reconstructed NMR image, and wherein the apparatus for obtaining an NMR signal includes apparatus for obtaining the NMR signal at times when cancellation of the signal component dependent on magnetic field inhomogeneities occurs. There is also provided a technique for NMR imaging using the above apparatus.

2 Claims, 15 Drawing Figures

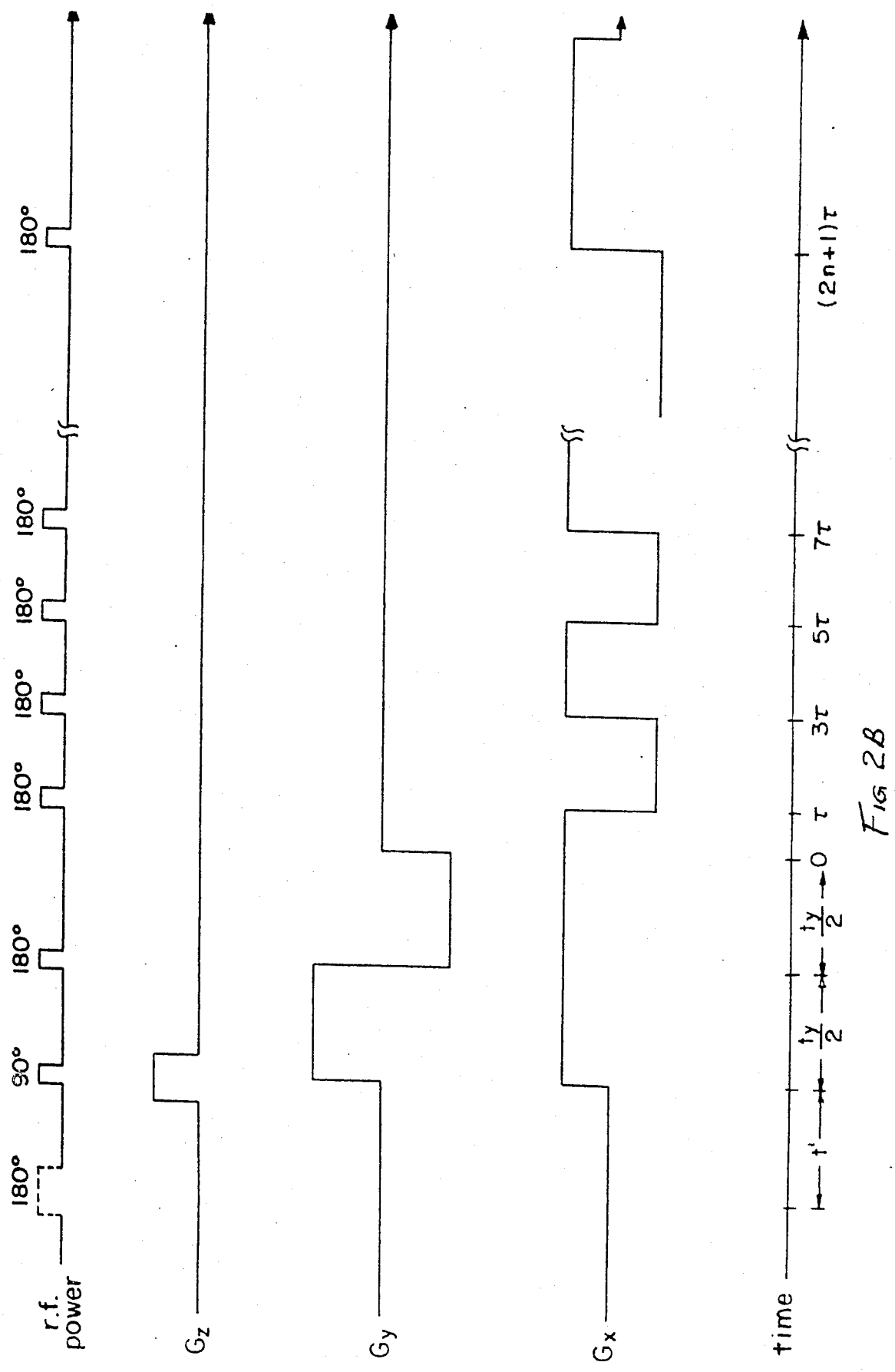

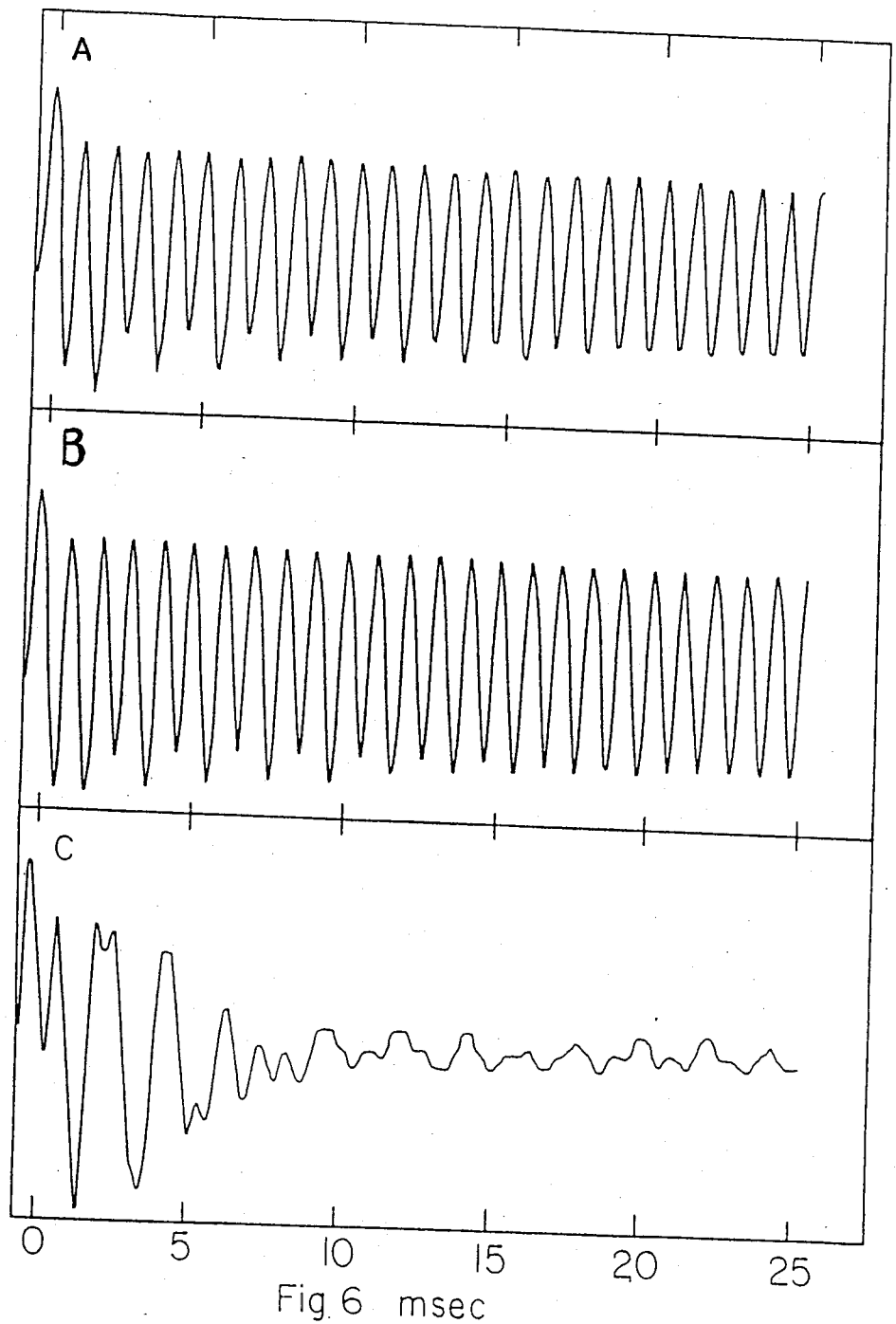
Fig. 6 msec

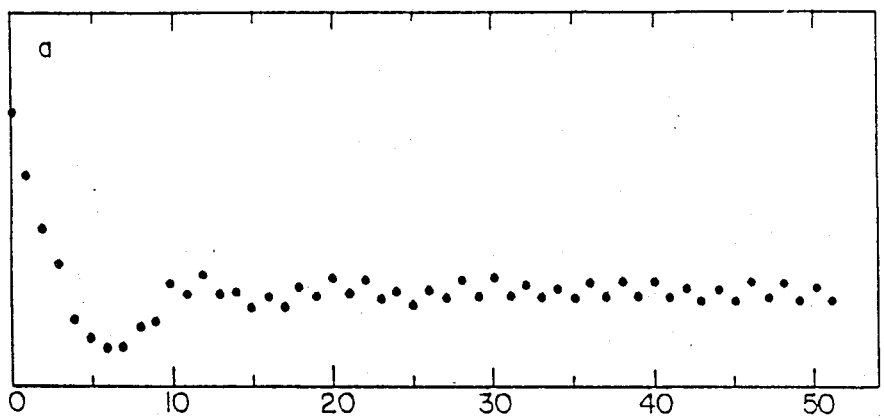
Fig. 7 msec
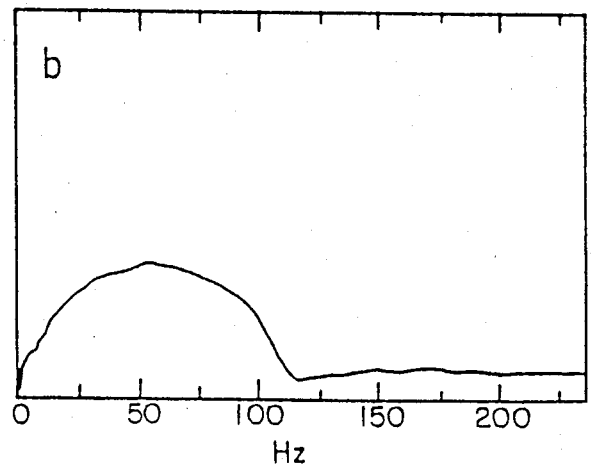
Fig. 8

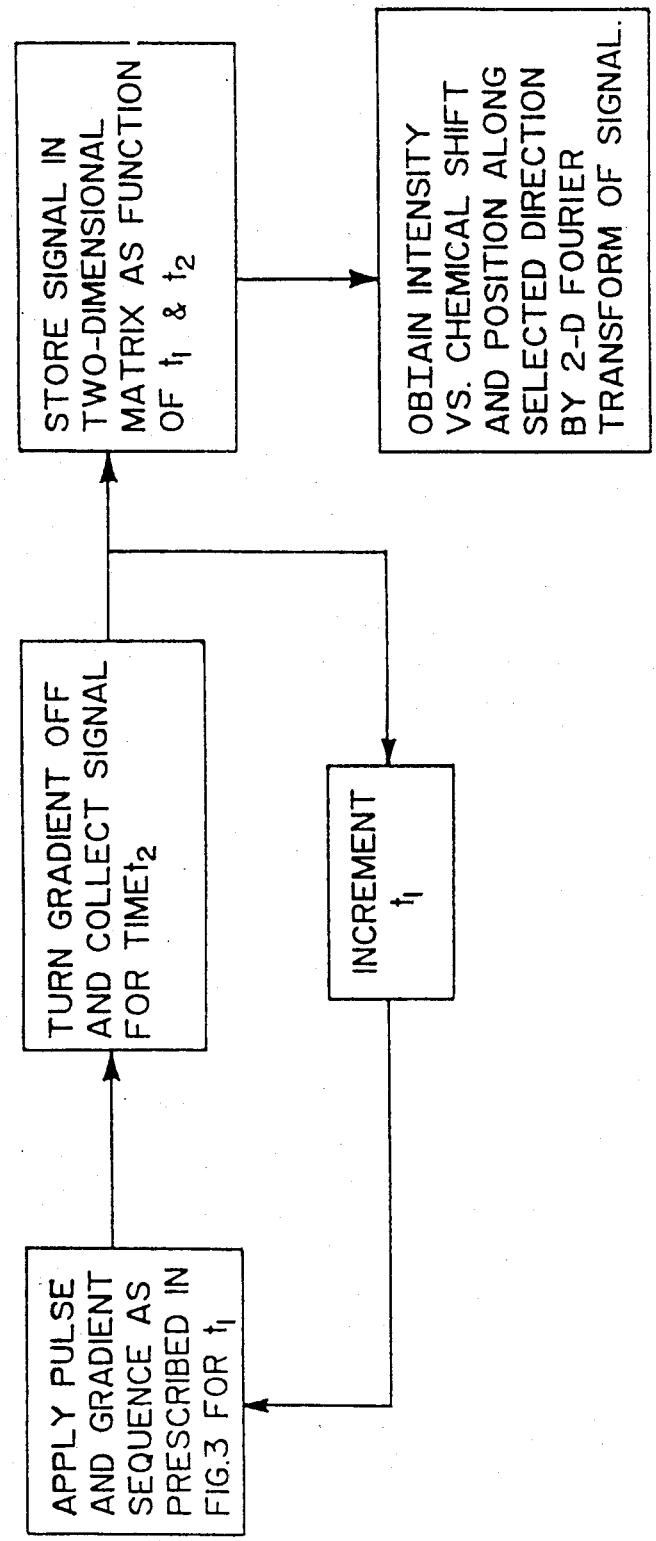
Fig. II

METHOD TO ELIMINATE THE EFFECTS OF MAGNETIC FIELD INHOMOGENEITIES IN NMR IMAGING AND APPARATUS THEREFOR

FIELD OF THE INVENTION

The present invention relates to nuclear magnetic resonance imaging generally and more particularly to apparatus and techniques for nuclear magnetic resonance imaging.

BACKGROUND OF THE INVENTION

Nuclear magnetic resonance imaging or zeugmatography employs the physical phenomenon of nuclear magnetic resonance to provide detection of the spatial distribution of certain nuclear spins at characteristic frequencies in the radiofrequency range. This spatial distribution provides information as to the state of corresponding areas of a sample, and provides resolution down to an order of about 1 mm in humans. Zeugmatography has been found to be particularly applicable to biological systems such as man because of its non-invasive and apparently hazard-free nature.

A review of NMR imaging techniques and applications appears in an article by R. M. Bottomley in Rev. Sci. Instrum. 53(9), September 1982, pages 1319 to 1336.

Briefly stated, the resonance frequency, known as the Larmor frequency, is related to the magnetic field which is applied to the sample by the following relationship:

$$\omega_o = -\gamma H_o \qquad (1)$$

where
- $\omega_o$ is the Larmor frequency,
- $H_o$ is the component of the applied magnetic field along a principal field axis z as experienced by the nucleus of the atom whose spin is detected, and
- $\gamma$ is the gyromagnetic ratio characteristic of each nuclear species.

By labelling the spins at different locations in the sample with differing Larmor frequencies it is possible to map the spin densities and relaxation times T1 and T2 in regions of the sample.

The major effort in the design of NMR imaging systems is directed to providing a magnetic field Ho which is space dependent in a known and predictable manner within the sample. This is normally achieved by superimposing a linearly varying field on the magnetic field existing within the sample by passing electric currents through suitably shaped gradient producing coils which surround the sample.

It may be understood from a consideration of equation (1) above, that reconstruction of the NMR image is based on the assumption that the known superimposed linear variation in the magnetic field is the only source of spatial magnetic field variation. In practice, however, this is not correct, since magnetic field inhomogeneities may appear as a result of external magnetic sources, inherent design and construction limitations and as the result of variations in magnetic susceptibility in the sample.

Conventionally, the problem of magnetic field inhomogeneities is overcome by a brute force technique, wherein the superimposed field gradients are caused to be so large as to dominate the inhomogeneities and thus render them inconsequential. Such a condition may be expressed by the following inequality:

$$\gamma G \delta x \geq 1/T_2^* \qquad (2)$$

where
- G is the applied field gradient,
- $\delta x$ is the required degree of linear spatial resolution demanded of the system, and
- $1/T_2^*$ is the width of the frequency signal from the sample in the absence of the applied gradient.

The frequency width $1/T_2^*$ can be expressed as:

$$1/T_2^* = 1/T_2 + \Delta\omega_{(inh)} \qquad (3)$$

where $1/T_2$ is the intrinsic linewidth of the nuclear absorption signal and $\Delta\omega_{(inh)}$ is the broadening of the frequency band caused by the magnetic field inhomogeneities. Normally $\Delta\omega_{(inh)}$ is much larger than $1/T_2$, typically by more than an order of magnitude.

The provision of large gradients for the purpose of overwhelming the magnetic field inhomogeneities involves very significant expenses in the construction and operation of the large magnets that are required. A correspondingly large investment in infrastructure is also required. The results produced nevertheless have a resolution limitation determined by the signal to noise characteristics thereof.

SUMMARY OF THE INVENTION

The present invention seeks to provide NMR imaging apparatus and techniques which overcome the difficulties and limitations associated with magnetic field inhomogeneities without requiring large applied magnetic field gradients.

There is thus provided in accordance with a preferred embodiment of the present invention NMR imaging apparatus comprising apparatus for applying a linear magnetic field gradient to a sample, apparatus for varying the magnetic field gradient in a predetermined manner, apparatus for obtaining an NMR signal based on the linear magnetic field gradient, apparatus for storing the NMR signal, apparatus for reconstructing an NMR image from the stored NMR signal, and display apparatus for displaying the reconstructed NMR image, and wherein the apparatus for obtaining an NMR signal includes apparatus for obtaining the NMR signal at times when cancellation of the signal component dependent on magnetic field inhomogeneities occurs.

Further in accordance with an embodiment of the present invention there is provided a technique for NMR imaging comprising the steps of applying a linear magnetic field gradient to a sample, varying the magnetic field gradient in a predetermined manner, obtaining an NMR signal based on the linear magnetic field gradient, storing the NMR signal, reconstructing an NMR image from the stored NMR signal, and displaying the reconstructed NMR image, and wherein the step of obtaining an NMR signal includes the step of obtaining the NMR signal at times when cancellation of the signal component dependent on magnetic field inhomogeneities occurs.

The present invention enables an improvement of system signal to noise characteristics by reducing the required magnetic field gradient and thereby reducing the frequency bandwith used for detection. The reduction in the frequency bandwith enables a higher quality Q factor RF coil to be used and noise filters having a reduced cut off frequency to be employed. The improvement of system signal to noise characteristics enables improvides resolution or shorter imaging time or a combination of the two to be realized in system operation.

BRIEF DESCRIPTION OF THE DRAWINGS

The present invention will be understood and appreciated more fully from the following detailed description taken in conjunction with the drawings in which:

FIG. 2B is a timing diagram illustrating operation of NMR imaging apparatus in accordance with an alternative embodiment of the present invention;

FIG. 6 includes NMR signal traces produced under a variety of different operating techniques, where in (A), the transverse magnetization obtained by a CPMG pulse train in the field corresponding to the spectrum of 5A and resulting from the averaging of 10 pulse trains, separated by a 2 sec delay is shown;

FIG. 7 is an NMR signal trace produced in accordance with the present invention by taking points from the signal of 6C at the times at which the echoes occur in the signal of 6B. The first 52 points from a total of 102 points are shown;

FIG. 8 is an NMR frequency spectrum produced by fourier transformation of the signal trace of FIG. 7, which is zero-filled from 102 to 256 points and to which an exponential multiplication corresponding to a Lorentzian linebroadening of 5 Hz was applied;

FIG. 11 is a block diagram flow chart illustrating operation of NMR imaging apparatus in accordance with an embodiment of the invention for providing a two-dimensional map of intensity versus linear position and chemical shift.

DETAILED DESCRIPTION OF THE INVENTION

Figure 1A:
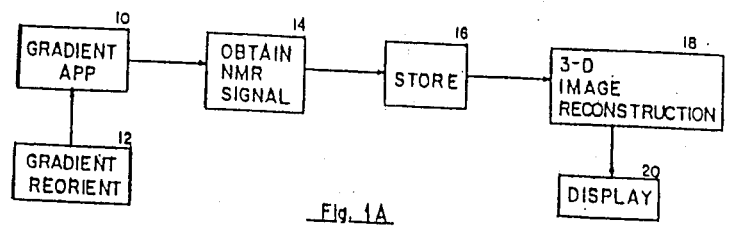
FIGS. 1A, 1B, 1C and 1D are block diagram illustrations of NMR imaging apparatus of three different types, each operating in accordance with a different imaging technique.
Figure 1B:
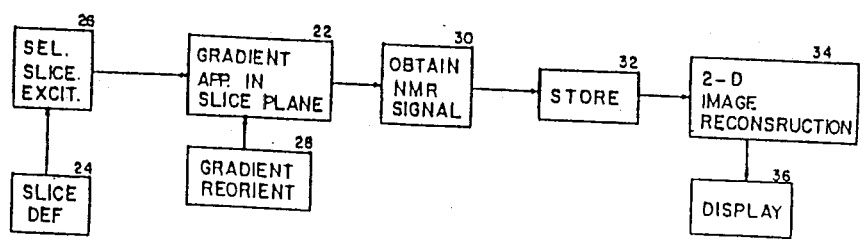
Figure 1C:
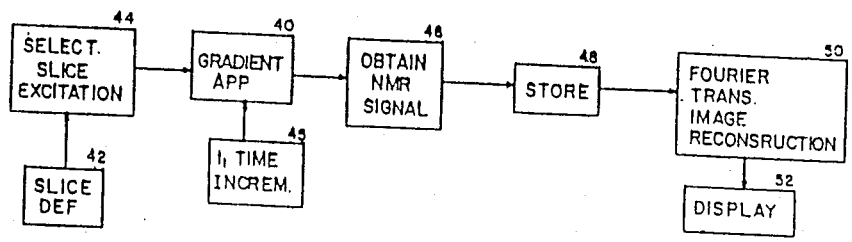

Reference is now made to FIGS. 1A–1C which illustrate in block diagram form three different types of NMR imaging apparatus implementations. FIG. 1A illustrates apparatus implemented to provide a three dimensional projection reconstruction of an NMR image and comprising means for applying a linear magnetic field gradient 10, means for reorienting the gradient direction in three dimensions 12 and means for obtaining an NMR signal from a sample in the presence of the linear magnetic field gradient 14. Means for storing the NMR signal in digitized form 16 receive the NMR signal and provide the stored signal to three-dimensional image reconstruction means 18 which output to a conventional display 20.

NMR imaging apparatus implemented to provide two dimensional selective slide imaging by two-dimensional projection reconstruction is illustrated in FIG. 1B and comprises means for applying a linear magnetic field gradient in the plane of a selected slice 22, means for defining the selected slice 24, means for performing selective excitation of the selected slice 26, means for reorienting the magnetic field gradient in two dimensions in the plane of the slice 28 and means for obtaining an NMR signal from a sample in the presence of a magnetic field gradient 30. Means for storing the NMR signal in digitized form 32 receive the NMR signal and provide the stored signal to two-dimensional image reconstruction means 34 which output to a conventional display 36.

NMR imaging apparatus implemented to provide two dimensional fourier zeugmatography is illustrated in FIG. 1C and comprises means for applying a linear magnetic field gradient in the plane of a selected slice for a time $t_1$ 40, means for defining the selected slice 42, means for performing selective excitation of the selected slice 44, means for incrementing the time t1 to means 40, and means 46 for obtaining an NMR signal from a sample in the presence of a magnetic field gradient which is perpendicular to the first gradient in the plane of the slice for a time t2. Means for storing the NMR signal in digitized form 48 receive the NMR signal and provide the stored signal to two-dimensional fourier transform image reconstruction means operating with respect to times $t_1$ and $t_2$ 50 which output to a conventional display 52.

Figure 1D:
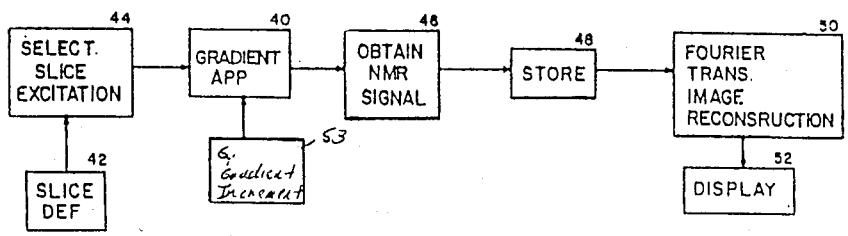

An alternative embodiment of the apparatus of FIG. 1C is illustrated in FIG. 1D. Here, instead of the $t_1$ time increment element 45, there is provided a $G_y$ gradient increment, identified by reference numeral 53.

The four implementations described above are all conventional implementations which are presently preferred and implemented in commercially available apparatus. The present invention relates to improvements in the means for obtaining the NMR signal in the linear magnetic field gradient.

It is noted that the implementation of FIG. 1A is most sensitive to the problem of magnetic field inhomogeneity and is set up to realize economies from reduction of current in the magnetic field gradient producing magnets. The implementation of FIG. 1B is affected by the problem of magnetic field inhomogeneities less than is the embodiment of FIG. 1A but more than is the implementation of FIGS. 1C and 1D.

The benefits arising from the reduction in gradient strength are applied to all three axes in the embodiment of FIG. 1A, to two axes in the embodiment of FIG. 1B and to one axis in the embodiments of FIGS. 1C and 1D. The benefits arising from the reduced detection bandwidth in terms of signal to noise improvements are common to all four embodiments. For the purpose of describing the invention, reference is now made to the timing diagram of FIG. 2A.

Figure 2A:
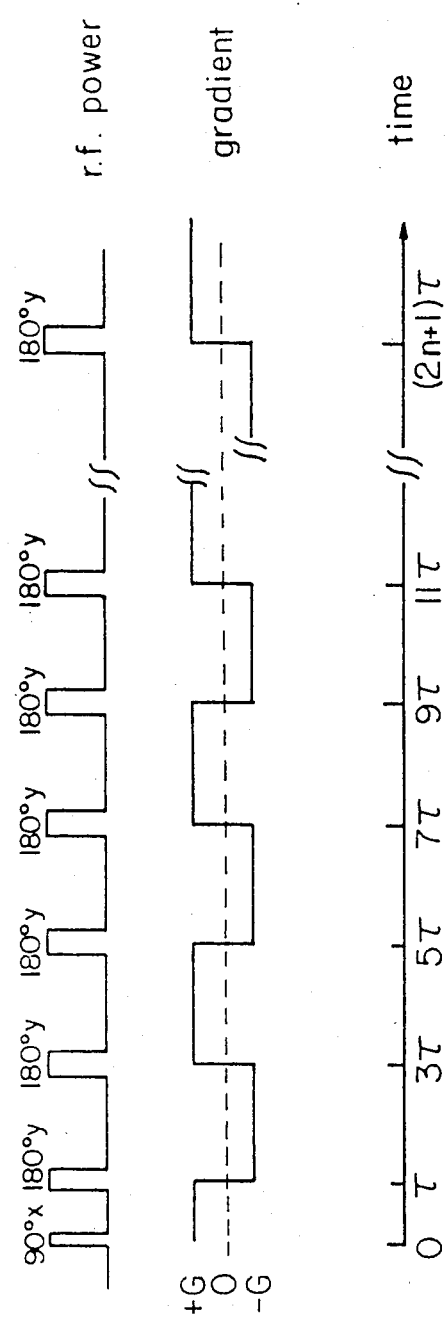
FIG. 2A is a timing diagram illustrating operation of NMR imaging apparatus in accordance with an embodiment of the present invention.

FIG. 2A is a timing diagram indicating on a single time scale, the RF pulses that are applied to the sample being tested, which for clarity are not drawn to scale as compared with the intervals between them, the magnetic gradient that is being applied to the sample being tested and the detection timing instants. According to a preferred embodiment of the invention, the onset of each of the 180 degree RF pulses is synchronized to coincide within an accuracy of less than about one microsecond with the shift in the magnetic field gradient. This shift may be in the form of square-wave modulation as illustrated in FIG. 2A. Alternatively more gradual sinusoidal gradient level changes may be employed. Detection of the NMR signal takes place precisely at a time equidistant between shifts in the magnetic field gradient. Therefore, if the 180 degree RF pulses and the magnetic gradient shifts occur precisely at times $t=\tau$, $3\tau$, $5\tau$, $7\tau$, etc, detection of the NMR signal occurs precisely at $t=2\tau$, $4\tau$, $6\tau$, etc.

In accordance with this preferred embodiment of the invention, at times $t=2n\tau$, where n is an integer, the phase angle of the isochromat vector at each location in the sample can be expressed as $$\theta_i(2n\tau) = -2n\gamma GX_i\tau \qquad (4)$$

whereas in general, for the k th interval of positive gradient amplitude:

$$\theta_i(t) = \omega_i(t-2n\tau) - \omega_i' 2n\tau \qquad (5)$$

and for the k th interval of negative gradient amplitude:

$$\theta_i(t) = -\omega_i(2n+1)\tau + \omega_i'[t-(2n+1)\tau] \qquad (6)$$

where in both cases:

$$n = k - 1 \qquad (7)$$

$$\omega_i = \gamma GX_i + \omega_o(x_i, y_i, z_i) \qquad (8)$$

$$\omega_i' = -\gamma GX_i + \omega_o(x_i, y_i, z_i) \qquad (9)$$

and where $x_i$, $y_i$ and $z_i$ are the spatial coordinates of the ith isochromat, and $\omega_o$ is its Larmor frequency in the rotating frame in the absence of any applied linear gradient.

It may be appreciated that while in the general case, the phase angle and thus the received NMR signal contains a dependency on the magnetic field inhomgeneities, in the specific case of $t=2n\tau$, the phase angle of the iscochromat vector is independent of the background inhomogeneities and depends only on the predetermined superimposed magnetic field gradient and on the spatial variable x.

Reference is now made to FIG. 2B which is a timing diagram illustrating the operation of the embodiment of FIG. 1D. In the embodiment of FIG. 1D, whose operation is illustrated in FIG. 2B the time ($t_1$ in FIG. 2B) is left constant and the amplitude of this gradient $G_y$ is varied.

As seen in FIG. 2B, the initial 180° pulse, illustrated in the dashed line and the interval $t'$ is optional if one wishes to encode $T_1$ dependence, as noted herein. The $G_z$ gradient is the so called "selection" gradient. A selective pulse in the presence of this gradient excites the signal only from a plane parallel to the X-Y plane at some selected height Z.

$G_y$ is the so-called "encoding" gradient. In order to obtain enough information to reconstruct the image of the slice, the run has to be repeated with different values of the $G_y$ amplitude.

The time $t'$ introduces a $T_1$ dependence into the image. The 180° pulse and $G_y$ reversal in the middle of the $t_y$ intervalreverses any dephasing due to field inhomogeneities at time $t=0$.

From time $t=0$ onward, the signal is collected in the usual manner in the presence of the 180° pulses, which may be either selective or nonselective) and the switched gradient, which is the "readout" gradient $G_x$.

Figure 3:
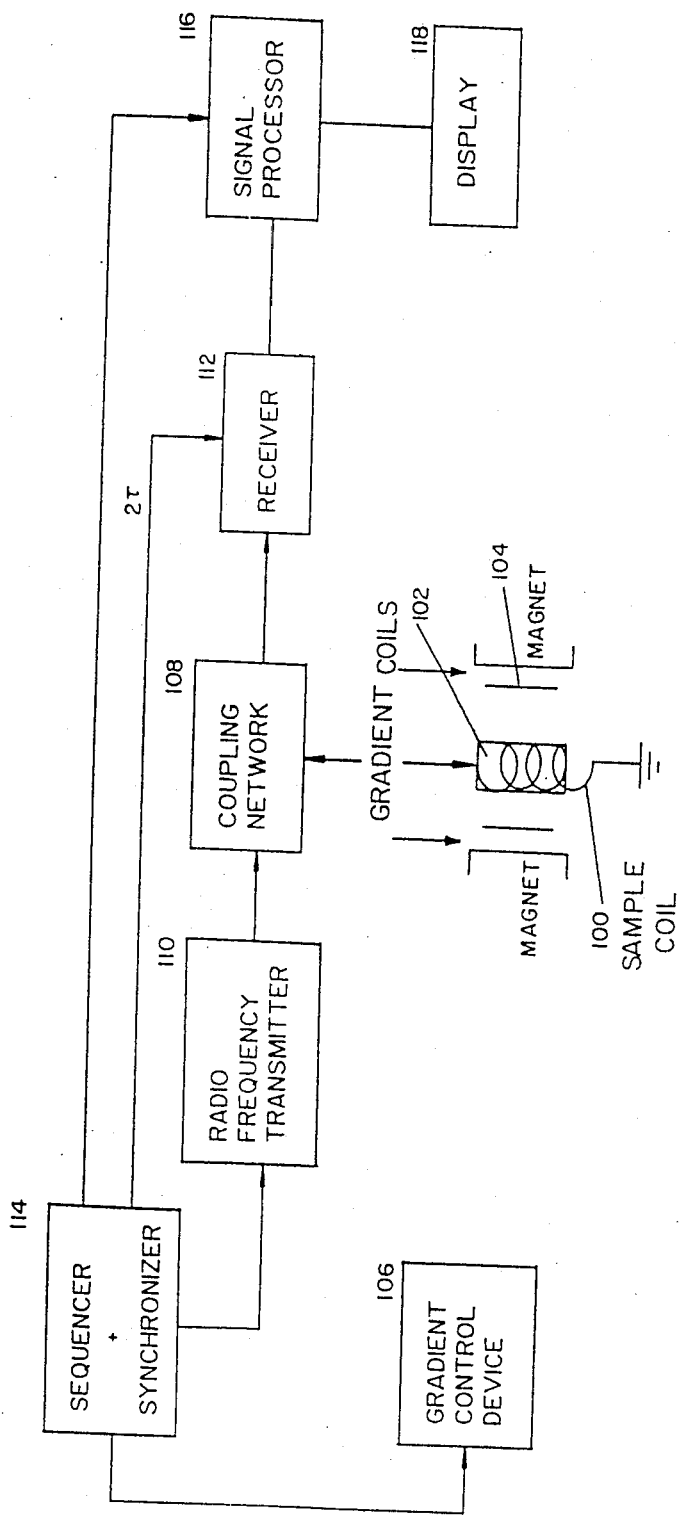
FIG. 3 is a block diagram flow chart illustrating the apparatus of the present invention.

Reference is now made to FIG. 3 which illustrates in block diagram form, apparatus for NMR imaging in accordance with the technique of FIG. 2A. The apparatus comprises a sample coil 100 surrounding a sample 102 to be investigated, magnetic gradient coils 104, surrounding the sample and the sample coil 102 and a gradient control device 106, such as an automatic or semiautomatically switched power supply.

A coupling network 108 couples the sample coil 102 to an RF transmitter 110 and to an NMR signal receiver 112. A sequencer and synchronizer 114, typically a suitably programmed dedicated minicomputer, provides control signals to the gradient control device 106, the RF transmitter 110 and to the NMR signal receiver 112 in order to coordinate the operation thereof in accordance with the timing diagram shown in FIG. 2, whereby operation of the the gradient control device 106 and the RF transmitter 110 are coordinated such that the RF pulse onset is precisely coordinated with the gradient shift at times (2n−1), where n is a non-zero integer and such that detection of the NMR signal or retention of such signal occurs for times 2n, where n is an integer. The provision of apparatus carrying out this predetermined sequencing is a primary feature of the present invention.

Applicants have carried out experimental tests of the present invention using a modified Bruker SXP-90 spectrometer, interfaced with a PDP 11/34 minicomputer. For a description of the experimental set up see S. Vega, Y. Naor, J. Chem Phys. Vol 75, page 75, (1980) and Y. Tsur, PhD. dissertation, Weizmann Institute of Science, Rehovot, Israel, 1982.

NMR signal excitation and detection at 90 MHz was achieved using a custom built Helmholtz coil, which was constructed in accordance with the teachings of D. I. Hoult, and R. E. Richards, Proc. R. Soc. Lond. A., Vol. 344, page 117, (1982). A pair of x- and z-gradient coils were wound around a temperature-control glass dewar in a twin quadrupole configuration similar to that described in I. Zupancic, J. Pirs., J. Phys. E: Sci. Instru., Vol 9, 79 (1976); M. E. Moseley, A. Loewenstein, Mol. Cryst. Liq. Cryst. Vol 90, 117 (1982).

Figure 4:
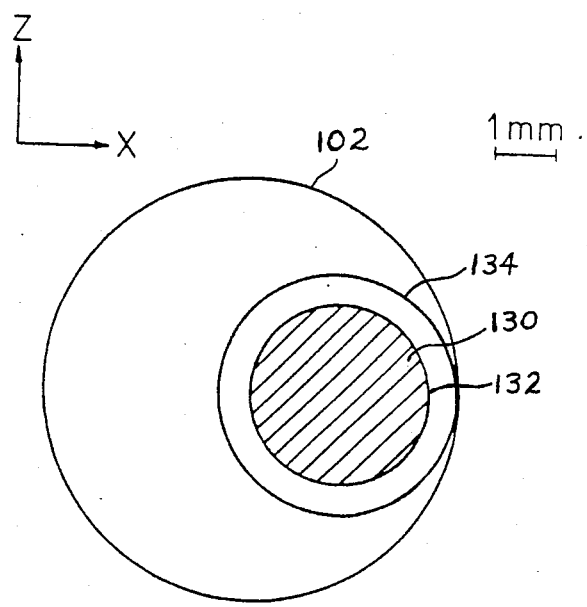
FIG. 4 is a diagrammatic illustration of an experimental set up employed in confirming the invention and illustrating a cross section through the sample.

A cross sectional illustration of the experimental set up is provided at FIG. 4. Here the sample 130 is located off center so that all of the detectable nuclei lie to one side of the null plane of the gradient. This arrangement simplifies the equipment requirements, since when spins with both positive and negative x-coordinates are present, a quadrature detection system is required.

The sample 130 is located within a tube 132 which contains a dilute solution of $NiCl_2$ in $D_2O$ for which the spin relaxation times $T_1 = T_2$ are about equal to 0.2 seconds. Tube 132 is in turn located in a second tube 134, which fits in a standard 8 mm sample holder located within the sample coil 102 (FIG. 3).

Figure 5:
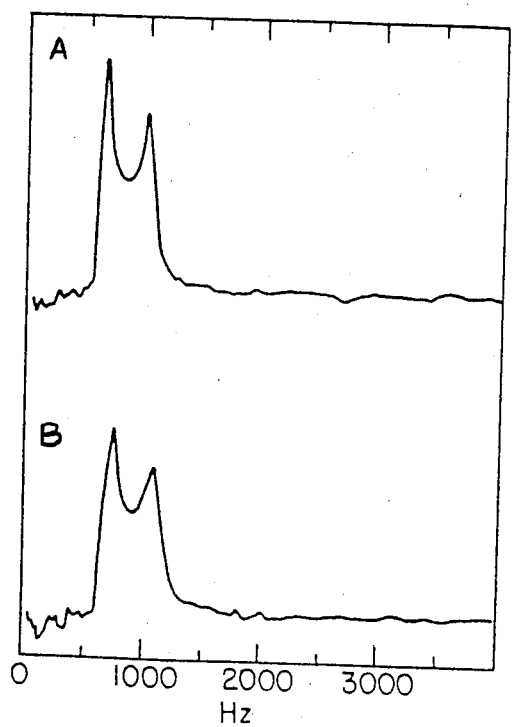
FIG. 5 includes illustrations of 90 MHz proton spectra of the sample depicted in FIG. 4 obtained by prior art techniques and demonstrating the deliberatedly created poor homogeneity of the magnetic field in the absence of the linear x-gradient (A) and in the presence of this gradient (B).

A magnetic field inhomgeneity was deliberated added to the magnetic field, principally by means of the addition of a linear y-gradient. The proton absorption spectrum realized from operation of the illustrated experimental set up of FIG. 4 is shown in FIG. 5A.

In accordance with prior art teachings, in order to obtain a spectrum which faithfully describes a one-dimensional projection of the sample of FIG. 4 along any desired direction, it would have been necessary to provide a magnetic field gradient in such a direction effective to spread the signal over much more than the 500 HZ signal width of the signal in FIG. 5A. In contrast to this prior art teaching, only a relatively small x-gradient was provided of the order of 0.08 Gauss per centimeter, which gradient was sufficiently small that the normal single-pulse absorption spectrum in the presence of this gradient only slightly perturbs the lineshape and position of the signal in the presence of only the unwanted inhomogeneity. FIG. 5B illustrates the transverse magnetization produced under the conditions applied in the example of FIG. 5A but in the presence of an additional constraint x-gradient.

FIGS. 6A, 6B and 6C illustrate the results of applying a CPMG (Carr-Purcell-Meiboom-Gill) pulse train under various conditions which will be described hereinafter. In FIG. 6A, the illustrated NMR signal results from the inhomogeneous field used to produce the spectrum of FIG. 5A. The results shown in this Figure were produced by a 14 microsecond duration for the $\pi/2$ pulses and a 28 microsecond duration for the $\pi$ pulses, which were applied every 1 msec. The signal was sampled at a 50 microsecond rate and the first 512 points of a total of 2048 points are illustrated.

FIG. 6B shows the NMR signal resulting from continuous application of the x-gradient, i.e. without periodic reversal. It is noted that there is no change between the signals of FIGS. 6A and 6B in the position and intensity of the echo peaks thereof. The only difference is a slight difference in the evolution between the echoes in the two signals.

FIG. 6C illustrates the effect of periodically reversing the x-gradient according to the timing diagram of FIG. 2.

If the signal of FIG. 6C is sampled precisely at the times $2n\tau$, in accordance with the teachings of the present invention, the trace illustrated in FIG. 7 is obtained. By applying a fourier transformation to the trace of FIG. 7, there is obtained the spectrum illustrated in FIG. 8.

It is noted that the total breadth of the signal thus obtained is only about 100 Hz which corresponds to an x-gradient of about 33 Hz/mm, or 0.08 G/cm, much less than the broadening caused by the inhomogeneous field.

Further in accordance with an embodiment of the present invention, solutions are presented to a number of potential problems which may arise in connection with the invention. One such potential problem is that of pulse imperfections in the r.f. pulses. This problem may be overcome by the use by sampling of the NMR signal at integer multiples of $4\tau$, instead of $2\tau$. Alternatively the 180° degree pulses can be replaced by composite pulses, which comprise a series of pulses with the overall effect of perfect 180° degree pulses. Such composite pulses are described, for example, by M. H. Levitt, R. Freeman in J. Mag. Res. Vol 43, p. 65, (1981).

Figure 9:
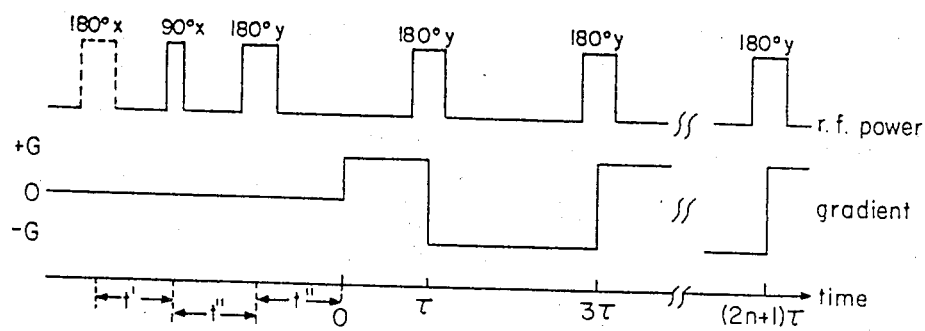
FIG. 9 is a timing diagram illustrating operation of NMR imaging apparatus in accordance with an alternative embodiment of the present invention.

Another potential problem associated with the invention is that of receiver dead time. This dead time relates to the physical limitations of the receiver and its inability to correctly record data for a finite time, typically $10^{-6}$–$10^{-5}$ sec following the pulse. The resulting loss of information causes some phase distortions in the spectrum. This problem may be overcome by initiating sampling at the onset of a "spin echo" which refocuses the magnetization as it was at the time of the $\pi/2$ pulse with the exception of a small attenuation which may be ignored. It is appreciated that the effective refocussing of the magnetization for overcoming the problem of receiver dead time may be achieved in various ways, including, for example, gradient reversal without the provision of a concomittant pulse.

Where it is desired to provide an NMR output indication not only of proton density but also of relaxation times T1 or T2, a timing and sampling regimen such as that illustrated in FIG. 9 may be employed. A T1 dependance may be introduced by providing an initial $\pi$ pulse as shown in phantom, followed by a waiting time t' of the order of the T1 values in the sample, after which the usual sequence begins. The T2 dependence is introduced even without this initial pulse by varying the delay t" (FIG. 9) to cover the order of magnitude of the T2 values in the sample.

In is appreciated that selective slice imaging may be realized in accordance with the present invention by the use of a selective $\pi/2$ pulse, an equivalent composite pulse or any other means which provides selective excitation such that only the magnetization for the desired slice lies in the transverse plane of the rotating frame at time t=0. Due to possible imperfections in the following 180° degree pulses, composite pulses may be employed for this purpose.

Figure 10:
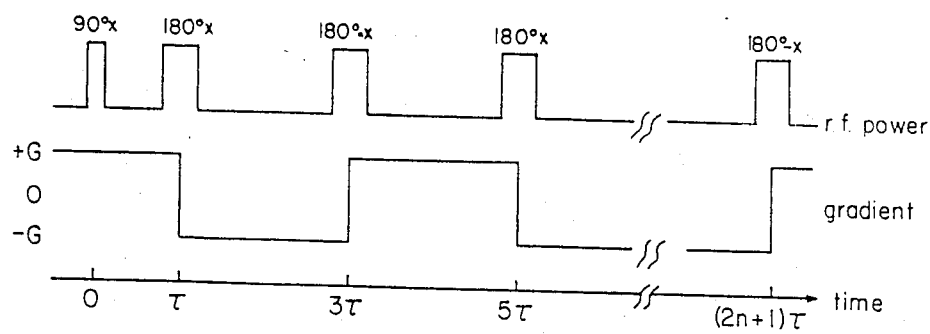
FIG. 10 is a timing diagram illustrating operation of NMR imaging apparatus in accordance with a further alternative embodiment of the present invention.

As an alternative embodiment, an excitation and sampling regimen illustrated in FIG. 10 may be employed in order to overcome the problem of pulse imperfections. The regimen of FIG. 5 has the additional advantage that it excludes contributions from regions which deliberately were left unexcited at t=0. The regimen of FIG. 10 may thus be the preferred regimen in a selective 2 dimensional imaging technique.

It is appreciated that if the Larmor frequencies of spins in the sample are also determined by chemical shifts or heteronuclear scalar splittings, these effects will be cancelled as are the effects of magnetic field inhomogeneities, in accordance with the present invention. If it is desired to preserve information resulting from chemical shifts or heteronuclear scalar splittings, the regimen of FIG. 11 may be employed. In this regimen the magnetization is excited by not detected for a variable time t1 which is an integer multiple of $2\tau$ or $4\tau$. The phase at the end of this period is a function of the spatial distribution of the sample as projected onto the axis selected by the gradient, independent of chemical shifts. At the end of this preparation period, both the r.f. pulses and the gradient are terminated and the signal then decays under the influence of only chemical shifts and coupling constants and also under the influence of magnetic field inhomogeneities. This signal decay is sampled for a time t2. A 2 dimensional fourier transformation with respect to t1 and t2 yields a two dimensional spectrum with the "high-resolution" spectrum along one axis and the spatial projection of each spectral line along the other. The intervals t1 and t2 can be interchanged with respect to the application of the switched gradient.

In summary, it may be appreciated that the present invention provides the following advantages:

1. Less stringent requirements regarding field inhomogeneity. Only homogeneity to the extent that requires all of the spins to be within the excitation bandwith of the r.f. system is required. This requirement is at least one order of magnitude less stringent than current specifications. The result of this lessening of requirements is significant savings in design, building, installation and shimming requirements for the imaging magnets.

2. Less stringent requirements for field stability. The invention requires stability only on the time scale of the separation between two successive sampling points, i.e. on the order of $10^{-3}$ seconds, as compared with conventional requirements of stability of the order of seconds or minutes, or even days if time-consuming re-shimming is to be avoided.

3. Smaller currents are required for gradient generation. The difference in requirements may be as great as one order of magnitude. The smaller currents require simpler and less costly switching and other apparatus and reduce the possible hazards associated with switching of large gradient currents. This benefit is maximized for full 3 dimensional projection reconstruction techniques but in partially realized also for other techniques.

4. Smaller frequency bandwidths may be used for detection. This benefit results from the use of smaller currents. The r.f. excitation power may correspondingly be reduced. Enhanced sensitivity and consequent improved resolution and/or lowered imagaing time result.

5. Enhanced imaging possibilities exist for magnetically heterogeneous matter wherein the magnetic field inhomogeneities made NMR imaging impractical previously.

6. Possibility of imaging of compounds having differing chemical shifts. As discussed above, the spurious signals resulting from chemical shifts can be eliminated in accordance with the present invention.

It will be apparent to persons skilled in the art that the present invention is not limited to what has been particularly shown and described herinabove. Rather the scope of the present invention is limited only by the claims which follow.

I claim:

1. NMR imaging apparatus comprising:
   means for applying a linear magnetic field gradient to a sample;
   means for varying the magnetic field gradient in a predetermined manner;
   means for providing r.f. excitation pulses to said sample;
   means for obtaining an NMR signal based on the linear magnetic field gradient;
   means for storing the NMR signal;
   means for reconstructing an NMR image from the stored NMR signal; and
   display means for displaying the reconstructed NMR image,
   wherein the means for obtaining an NMR signal includes means for obtaining the NMR signal at times when cancellation of the signal component dependent on magnetic field inhomogeneities occurs,
   and wherein said means for providing excitation signal pulses to said sample is operative to provide excitation signal pulses whose onset corresponds with the change in sign of the magnetic field gradient provided by said means for varying the magnetic field.

2. A technique for NMR imaging comprising the steps of:
   applying a linear magnetic field gradient to a sample;
   varying the magnetic field gradient in a predetermined manner;
   providing r.f. excitation pulses to said sample;
   obtaining an NMR signal based on the linear magnetic field gradient;
   storing the NMR signal;
   reconstructing an NMR image from the stored NMR signal; and
   displaying the reconstructed NMR image,
   wherein the step of obtaining an NMR signal includes the step of obtaining the NMR signal at times when cancellation of the signal component dependent on magnetic field inhomogeneities occurs,
   and wherein said step of applying r.f. excitation signal pulses to said sample includes the steps of providing excitation signal pulses whose onset corresponds with the change in sign of the magnetic field gradient provided by said means for varying the magnetic field.

* * * * *